(12) United States Patent
Tamaoki

(10) Patent No.: US 8,693,514 B2
(45) Date of Patent: Apr. 8, 2014

(54) PULSE GENERATION METHOD AND LASER LIGHT SOURCE APPARATUS

(75) Inventor: Shinobu Tamaoki, Yokohama (JP)

(73) Assignee: Megaopto Co., Ltd., Wako-shi (JP)

( * ) Notice: Subject to any disclaimer, the term of this patent is extended or adjusted under 35 U.S.C. 154(b) by 0 days.

(21) Appl. No.: 12/755,918

(22) Filed: Apr. 7, 2010

(65) Prior Publication Data

US 2010/0260216 A1  Oct. 14, 2010

(30) Foreign Application Priority Data

Apr. 9, 2009 (JP) ................................. 2009-095074

(51) Int. Cl.
*H01S 3/10* (2006.01)

(52) U.S. Cl.
USPC .......................................................... 372/25

(58) Field of Classification Search
USPC ..................................... 372/25, 38.01, 38.02
See application file for complete search history.

(56) References Cited

U.S. PATENT DOCUMENTS

| | | | | |
|---|---|---|---|---|
| 5,394,416 | A * | 2/1995 | Ries | 372/26 |
| 6,928,094 | B2 * | 8/2005 | Asuri et al. | 372/38.02 |
| 7,061,950 | B2 * | 6/2006 | Hongo et al. | 372/38.02 |
| 7,184,671 | B2 * | 2/2007 | Wang | 398/195 |
| 7,426,224 | B2 * | 9/2008 | Ishibashi | 372/29.01 |
| 7,783,204 | B2 * | 8/2010 | Ishibashi | 398/198 |
| 2007/0081565 | A1 * | 4/2007 | Sasada et al. | 372/28 |
| 2010/0007300 | A1 * | 1/2010 | Hein et al. | 318/503 |

FOREIGN PATENT DOCUMENTS

| | | |
|---|---|---|
| JP | 2007-042981 | 2/2007 |
| JP | 2007-2494682 | 11/2007 |

OTHER PUBLICATIONS

Office Action in Japanese Patent Application No. 2009-095074 dated Jul. 23, 2013.

* cited by examiner

*Primary Examiner* — Jessica Stultz
*Assistant Examiner* — Tuan Nguyen
(74) *Attorney, Agent, or Firm* — Venable LLP; Michael A. Sartori; Tamatane J. Aga

(57) ABSTRACT

The present invention enables simultaneous setting or automatic setting of a pulse peak and a pulse width of a light pulse. In a configuration comprising a light emitting element outputting laser light, a driving current supply section supplying a driving current to the light emitting element, a modulator applying a modulation voltage for pulse modulation of the laser light to the light emitting element, and a modulation control section controlling a modulation pattern as a pattern of pulse modulation of the modulation voltage for the modulator, the modulation control section sets a modulation voltage value in the modulation pattern based on information on a driving current value, and sends information on the modulation pattern to the modulator so that the modulation voltage reaches the set value.

8 Claims, 14 Drawing Sheets

(a)

(b)

(a)

(b)

|  | CONDITION 1 (G1010) | CONDITION 2 (G1020) | CONDITION 3 (G1030) | CONDITION 4 (G1040) |
|---|---|---|---|---|
| DRIVING CURRENT (mA) | 100 | 200 | 200 | 200 |
| MODULATOR AMPLITUDE (mV) | 200 | 200 | 100 | 100 |
| MODULATOR OFFSET (mV) | 100 | 116 | 116 | 125 |

PULSE GENERATION METHOD AND LASER LIGHT SOURCE APPARATUS

BACKGROUND OF THE INVENTION

1. Field of the Invention

The present invention relates to a laser light source apparatus preferable as a light source having a light emitting element which outputs high power laser light to be used for optical fiber lasers, etc., and a pulse generation method of stably generating light pulses in the laser light source apparatus. In particular, the laser light source apparatus is preferable as a laser light source apparatus for a light emitting element of MOPA. In the present application, the light emitting element is a photoelectric conversion light emitting element capable of high power output, such as a LD (Laser Diode) or VCSEL (Vertical Cavity Surface Emitting laser: surface emitting laser).

2. Related Background Art

At present, a processing technique using pulsed laser light which is repeatedly outputted at a predetermined period has attracted attention, and demand for high power laser light sources has increased in the fields of processing and medical treatment. One type of laser light source which has especially attracted a great deal of attention among various laser light sources is optical fiber lasers. The optical fiber laser adopts, as an optical amplification medium, an amplification optical fiber having a core doped with a rare earth element such as Yb (Ytterbium), Er (Erbium), or Tm (Thulium). When pumping light is supplied into the amplification optical fiber, seed light propagating inside the amplification optical fiber is amplified. Accordingly, from the amplification optical fiber, amplified light with high power is outputted, or laser light is outputted by laser oscillation by using a resonator structure. Advantages of the optical fiber lasers are ease in handling due to confinement of laser light within the optical fiber and needlessness of large-scale cooling equipment due to high thermal emissivity.

As described above, rare earth element-doped fibers are applied to the optical fiber lasers, and among these rare earth element-doped fibers, a fiber doped with Yb with high conversion efficiency is widely used as an amplification optical fiber for high power output. Yb is also pumped by using pumping light as in the case of other rare earth elements. On the other hand, pumping light which cannot be absorbed inside the amplification optical fiber is made to exit from the other end of the amplification optical fiber.

As a configuration of the optical fiber laser, for example, when a resonator structure using a Fiber Bragg Grating (FBG) or a reflecting mirror, etc., on both ends is adopted, pulse modulation is performed by disposing an optical switch or an Acoustic Optical Modulator (AOM) inside the resonator. The MOPA (Master Oscillator Power Amplifier) type optical fiber laser described in Japanese Patent Publication Laid-Open No. 2007-042981 obtains high-power output light by amplifying a light pulse obtained by pulse modulation performed by direct modulation or external modulation of a seed light source (light emitting element) which outputs light to be amplified. In each configuration, a peak output obtained by pulsing seed light is much higher than the output in continuous wave operation (CW operation), and causes a nonlinear phenomenon such as Stimulated Raman Scattering (SRS) or Stimulated Brillouin Scattering (SBS).

In the MOPA type optical fiber laser, when an external modulation method is used in which pulse modulation is externally applied to an output light of a seed light source, pulse modulation control (one control period consists of a duration corresponding to the width of the light pulse, set to be in a pulse-ON state, and a duration corresponding to an interval between adjacent light pulses, set to be in a pulse-OFF state) can be performed by controlling a specific voltage value to be applied to an external modulator such as an AOM. Similarly, in the case of a direct modulation method in which direct pulse modulation is controlled for a seed light source, a method in which a voltage of a TTL signal (5 to 0 V) and a low volt TTL signal (3.3 to 0 V) are applied to the seed light source is known as a method of pulsing output light of the seed light source according to a pulse modulation pattern of a driving current to be supplied to the seed light source. Whether the duration of high-voltage application is set to be in the pulse-ON state or the pulse-OFF state depends on the electric circuit design, however, each of these requires a high application voltage, and causes an increase in size of the electric circuit of the modulator and an increase in electric power consumption. When the pulse responsiveness of the modulator itself, specifically, if the rising time and the falling time are late, switching between the pulse-ON state and the pulse-OFF state takes a longer time and delays. As a result, there is a risk that the pulse width (full width at half maximum) of the obtained seed light pulse L becomes narrower. It is also possible to control the specific modulation voltage to be applied to the seed light source when the driving current is changed, however, in this case, there is a possibility that control is not successfully performed or delayed, light pulses with a normal pulse width cannot be obtained, and the amplification optical fiber does not send the seed light pulses. In this case, a large amount of ASE light caused in the amplification optical fiber may damage other optical components (isolator and pumping light source, etc.) and the amplification optical fiber.

SUMMARY OF THE INVENTION

The present inventors have examined conventional optical fiber lasers adopting light pulses as seed light, and as a result, have discovered the following problems.

In a case where a light emitting element which outputs pulsed laser light with high power to be repeatedly outputted at a predetermined period had a configuration (direct modulation method), when pulse modulation was directly applied while the pulsed light to be outputted was set to a special pulse peak value, a phenomenon, in which the pulse width changed in accordance with the change of the driving current to be supplied to the seed light source, was found. For example, when the optical fiber laser was operated at a pulse width of 20 ns and a recurrence frequency of 50 kHz, the pulse width increased to 40 ns when the driving current value was changed. In the pulse modulation pattern showing time changes in modulation voltage with a pulse width and a recurrence frequency arbitrarily set, a modulation voltage value for determining an amplitude voltage and an offset voltage also needs to be readjusted. Further, the adjustment takes time, and in a case where an adjustment failure occurs, in the MOPA type optical fiber laser using this light emitting element as a seed light source, failures may occur in optical components such as the amplification optical fiber, the isolator, and the pumping light source.

In a method in which the output pulse is controlled by fluctuating only the current value of the driving current to be supplied to the seed light source, influences of transient response and fluctuation of the light source temperature at the rise of the driving current may make the output light power unstable. In order to reduce the influences of transient response and temperature fluctuation, when the driving current value to be supplied to the seed light source is fixed, the output light power of the seed light source itself is made stable by adjusting the modulation voltage value. However, as described above, when the output light becomes unstable, the driving current value needs to be changed, and for each setting change in driving current value, the modulation voltage value needs to be changed. The inventors found problems in that the setting of the modulation voltage for each change in driving current value is very troublesome and simple change in modulation voltage value fluctuates the pulse width of the output pulse.

The present invention has been developed to eliminate the problems described above. It is an object of the present invention to provide a pulse generation method and a laser light source apparatus which enable simultaneous setting of the pulse peak and the pulse width of the light pulse to desired values in setting of conditions of direct modulation of a light emitting element. The present invention also aims at provision of a pulse generation method and a laser light source apparatus capable of automatically setting the pulse peak and the pulse width of the light pulse.

A pulse generation method of a light emitting element according to the present invention is applied to a configuration comprising: a light emitting element outputting laser light; a driving current supply section supplying a driving current to the light emitting element; a modulator applying a modulation voltage for pulse modulation of the laser light to the light emitting element; and a modulation control section controlling a modulation pattern as a pattern of pulse modulation of the modulation voltage for the modulator.

Particularly, in the pulse generation method of a light emitting element according to the present invention, the modulation control section sets a voltage value in the modulation pattern based on information on the driving current value, and sends information on the modulation pattern to the modulator so that the modulation voltage reaches the set value.

The light emitting element means, in concrete terms, a photoelectric conversion light emitting element capable of realizing high power output such as LD (Laser Diode) and VCSEL. "Information on a driving current value" means not only a driving current value to be actually outputted from the driving current supply section, but also a target driving current value when the driving current value is controlled to the target value.

In the pulse generation method of a light emitting element according to the present invention, it is preferable that the driving current to be outputted from the driving current supply section is controlled so as to become fixed at a predetermined value in a period in which the modulation voltage value is fixed in the pulse modulation pattern. The modulation voltage value is changed based on information on the changed driving current value.

It is also allowed that the driving current to be outputted from the driving current supply section is controlled so that a monitor value of power of output light of the light emitting element reaches a predetermined value. The monitor value is an electric signal from a back monitor detector provided inside the light source or a photodetector provided outside the light source.

In the pulse generation method of a light emitting element according to the present invention, correspondence relationship between the driving current value and the modulation voltage value is preset as a correspondence table or a correspondence function, and the modulation voltage value is set based on information on the driving current value and the correspondence relationship.

A laser light source apparatus according to the present invention comprises a light emitting element outputting laser light, a driving current supply section supplying a driving current to the light emitting element, a modulator applying a modulation voltage for pulse modulation of laser light to the light emitting element, and a modulation control section controlling a modulation pattern as a pattern of pulse modulation of the modulation voltage for the modulator.

In particular, in the laser light source apparatus according to the present invention, the modulation control section has a storage section storing correspondence relationship between the driving current value and the modulation voltage value, and an arithmetic section setting the modulation voltage value in the modulation pattern based on information on the driving current value and the correspondence relationship between the driving current value and the modulation voltage value. The modulation control section sends information on the modulation pattern to the modulator so that the modulation voltage reaches a reset value according to change in information on the driving current value.

In the laser light source apparatus according to the present invention, the storage section stores correspondence relationship between the driving current value and the modulation voltage value as data in the form of a correspondence table. In addition, the storage section may store the correspondence relationship between the driving current value and the modulation voltage value as a correspondence functional equation.

DESCRIPTION OF THE PREFERRED EMBODIMENTS

Figure 1:
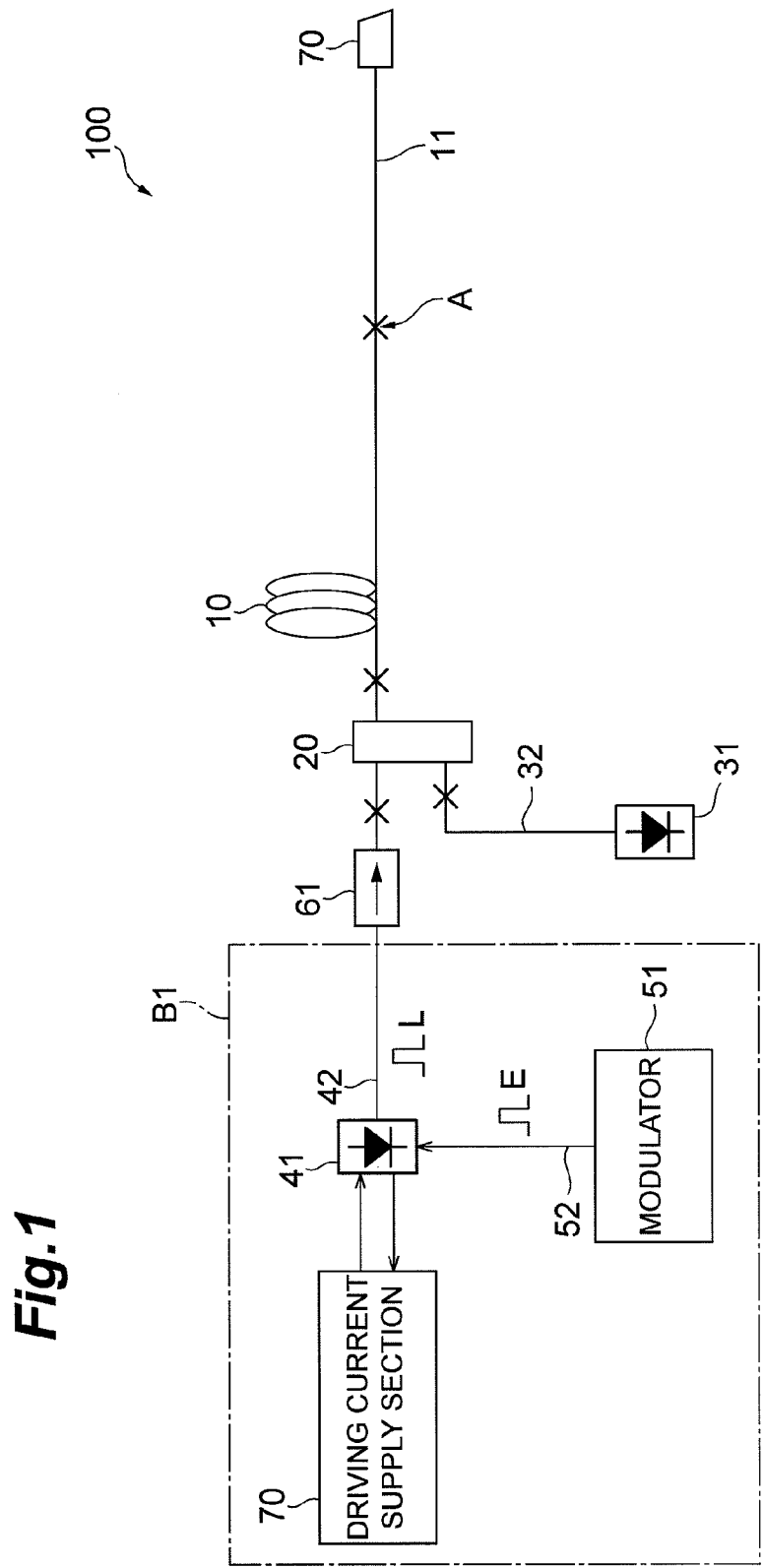
FIG. 1 is a view showing a configuration of an optical fiber laser to which a laser light source apparatus according to a comparative example is applied.

In the following, a pulse generation method and a laser light source apparatus according to the present invention will be explained in detail with reference to FIGS. 1, 2A to 2B, 3, 4A to 4B, 5 to 6, 7A to 8B, 9 to 10, 11A to 11C, and 12 to 14. In the description of the drawings, identical or corresponding components are designated by the same reference numerals, and overlapping description is omitted.

In the following explanation, a comparative example which should be compared with the present embodiments will be described first, and then the present embodiments and exemplary variations will be described in comparison with the comparative example.

FIG. 1 shows a configuration of an optical fiber laser to which a laser light source apparatus according to a comparative example is applied instead of the laser light source apparatus of the present invention, and specifically, shows a configuration of a MOPA type optical fiber laser. In FIG. 1, the optical fiber laser 100 comprises an amplification optical fiber 10, a combiner 20, a pumping light source 31, an optical fiber 32, a laser light source apparatus B1, an optical isolator 61, a delivering optical fiber 11, and a light exit end 70. The laser light source apparatus B1 comprises a seed light source 41, an optical fiber 42, a modulator 51, an electric signal line 52, and a driving current supply section 70. In the optical fiber laser 100 of FIG. 1, by applying direct modulation to the seed light source 41 to be supplied with a driving current from the driving current supply section 70 according to a predetermined basic pulse modulation pattern installed inside the modulator 51, a seed light pulse L is repeatedly generated. The basic pulse modulation pattern setting operation in the modulator 51 may be manually performed or performed via an external trigger signal line.

In the optical fiber laser 100, the pumping light was emitted from the pumping light source 31 and passed through the optical fiber 32, and a seed light pulse L (light to be amplified) was emitted from the seed light source 41 and passed through the optical isolator 61. Then these pumping light and seed light pulse L are combined by a combiner 20. The combined light from the combiner 20 is made incident on one end of the amplification optical fiber 10. Inside the amplification optical fiber 10 through which the combined pumping light and seed light pulse L propagate, a rare earth element (Yb, Er, Tm, Ho, Nd, Pr, Tb, etc.) with which the amplification optical fiber 10 is doped is pumped by the pumping light, and accordingly, the seed light pulse L is amplified. Then, the seed light pulse L amplified in the amplification optical fiber 10 passes through the delivering optical fiber 11 fusion-spliced to the other end A of the amplification optical fiber 10, and is then outputted to the outside from the light exit end 70.

Figure 2:
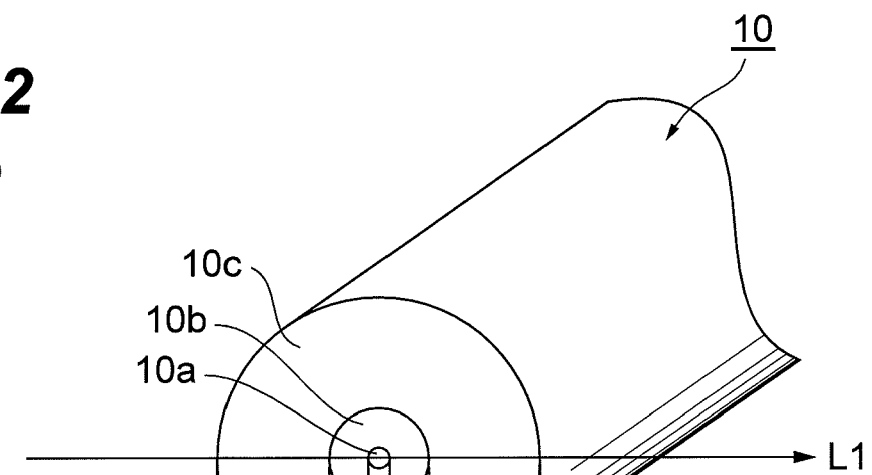
FIGS. 2A and 2B are a view showing a sectional structure of an amplification optical fiber and a refractive index profile of the same.
Figure 2:
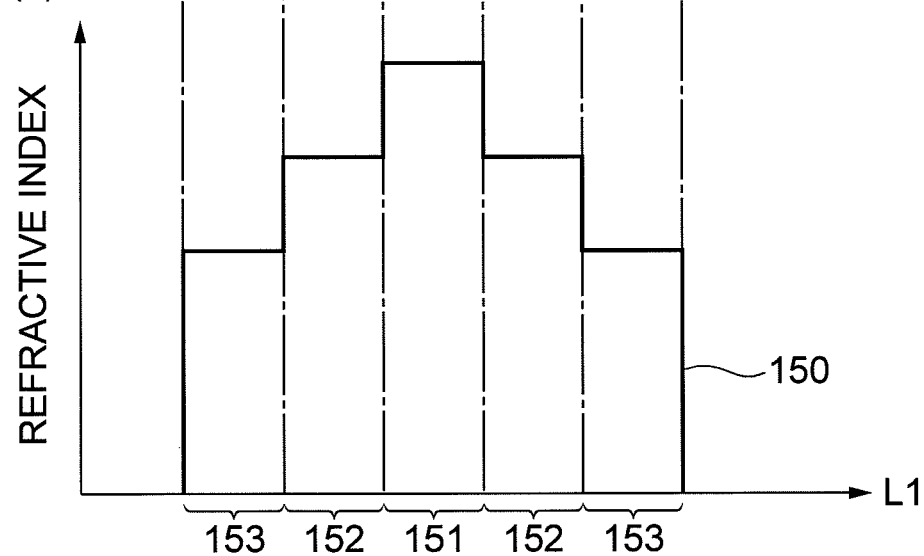

For example, the amplification optical fiber 10 has a sectional structure and a refractive index profile shown in FIGS. 2A and 2B. In particular, as shown in FIG. 2A, the amplification optical fiber 10 includes a core 10a with a predetermined refractive index, extending along a predetermined axis, a first cladding 10b with a refractive index lower than that of the core 10a, provided on the outer periphery of the core 10a, and a second cladding 10c with a refractive index lower than that of the first cladding 10b, provided on the outer periphery of the first cladding 10b. FIG. 2B shows a refractive index profile 150 along the radial direction L1 of the amplification optical fiber 10 (direction orthogonal to the optical axis of the amplification optical fiber 10). The region 151 shows a refractive index along the radial direction L1 of the core 10a, the region 152 shows a refractive index along the radial direction L1 of the first cladding 10b, and the region 153 shows a refractive index along the radial direction L1 of the second cladding 10c. The core 10a, the first cladding 10b, and the second cladding 10c constitute a double cladding structure. The core 10a makes the seed light propagate in a single mode, and first cladding 10b makes the pumping light propagate in a multi mode. The core 10a is doped with Yb as a rare earth element, and the seed light pulse is amplified inside the core 10a.

Figure 3:
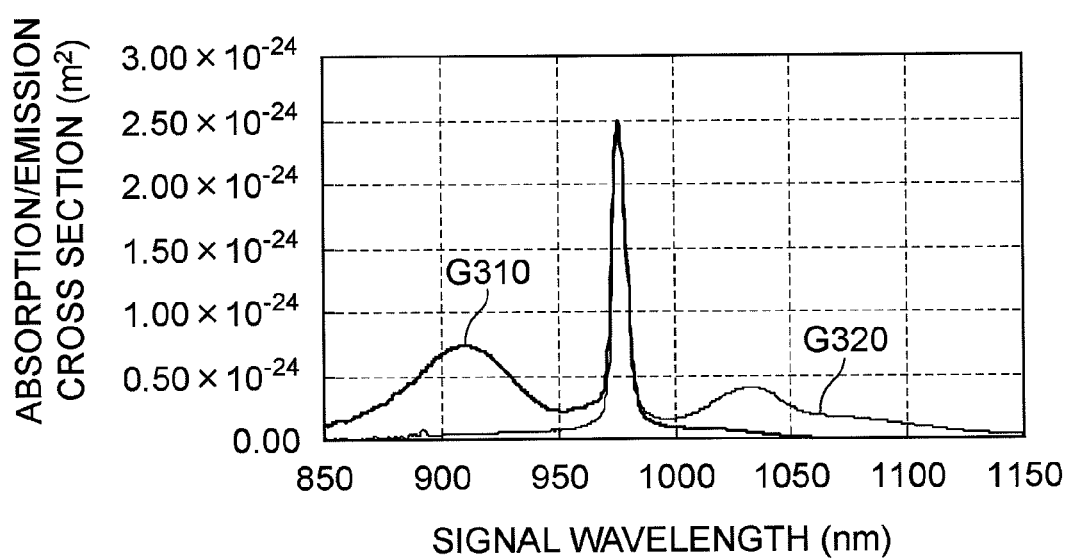
FIG. 3 is a graph showing wavelength dependencies of an absorption cross section and an emission cross section of the amplification optical fiber.

Pumping light absorption in the amplification optical fiber 10 is determined according to the characteristics of the amplification optical fiber 10, and is changed mainly by the mode field diameter (MFD), the outer diameter of the first cladding 10b, and adjustment of the rare earth element doping concentration in the core 10a. FIG. 3 shows wavelength dependencies of the absorption cross section and the emission cross section of the Yb-doped optical fiber. The graph G310 shows the absorption cross section, and G320 shows the emission cross section. In the Yb-doped optical fiber (corresponding to the amplification optical fiber 10), an Yb doping amount is 10000 ppm, an MFD is 7 μm, an outer diameter of a first cladding 10b is 130 micrometers, and its length is 5 m. And then pumping light of approximately 2.4 dB is absorbed in the 915 nm wavelength band of the pumping wavelength. The wavelength band of the pumping light may be a 940 nm band or a 975 nm band, however, it varies depending on the kind of the doped rare earth element.

The pumping light source 31 includes, for example, a semiconductor LD. A wavelength of pumping light to be outputted from the pumping light source 31 is in a 915 nm band, 940 nm band, or 975 nm band. The seed light source 41 includes, for example, an LD and a VCSEL. The modulator 51 directly modulates the seed light source 41 by applying a driving electric signal to the seed light source 41 via an electric signal line 52 (pulse modulation). In the present first embodiment, the wavelength of the seed light pulse L to be outputted from the seed light source 41 is in the wavelength range of 1030 to 1130 nm, and is, for example, 1060 nm.

Figure 4:
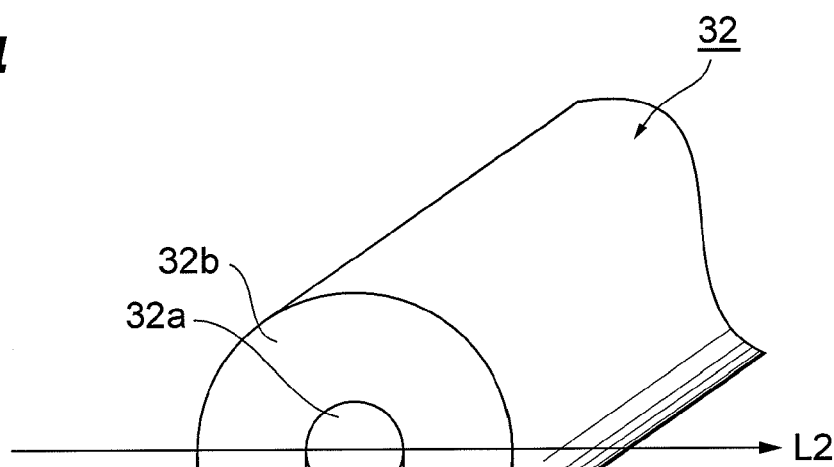
FIGS. 4A and 4B are a view showing a sectional structure of a delivering optical fiber and a refractive index profile of the same.
Figure 4:
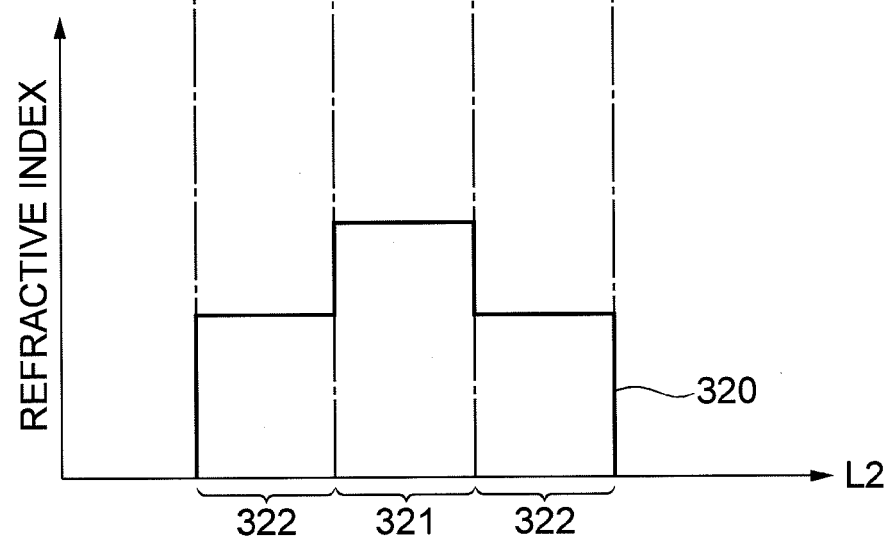

The optical fiber 32 and the delivering optical fiber 11 provided between the pumping light source 31 and the combiner 20 have the sectional structure and the refractive index profile shown in FIGS. 4A and 4B. That is, as shown in FIG. 4A, the optical fibers 32 and 11 include a core 32a with a predetermined refractive index extending along a predetermined axis and a cladding 32b with a refractive index lower than that of the core 32a, provided on the outer periphery of the core 32a. FIG. 4B shows a refractive index profile 320 along the radial direction L2 of the optical fiber 32 (direction orthogonal to the optical axis of the optical fiber 32), and the region 321 shows a refractive index along the radial direction L2 of the core 32a, and the region 322 shows a refractive index along the radial direction L2 of the cladding 32b. The core 32a makes pumping light outputted from the pumping light source 31 propagate in a multi mode.

Figure 5:
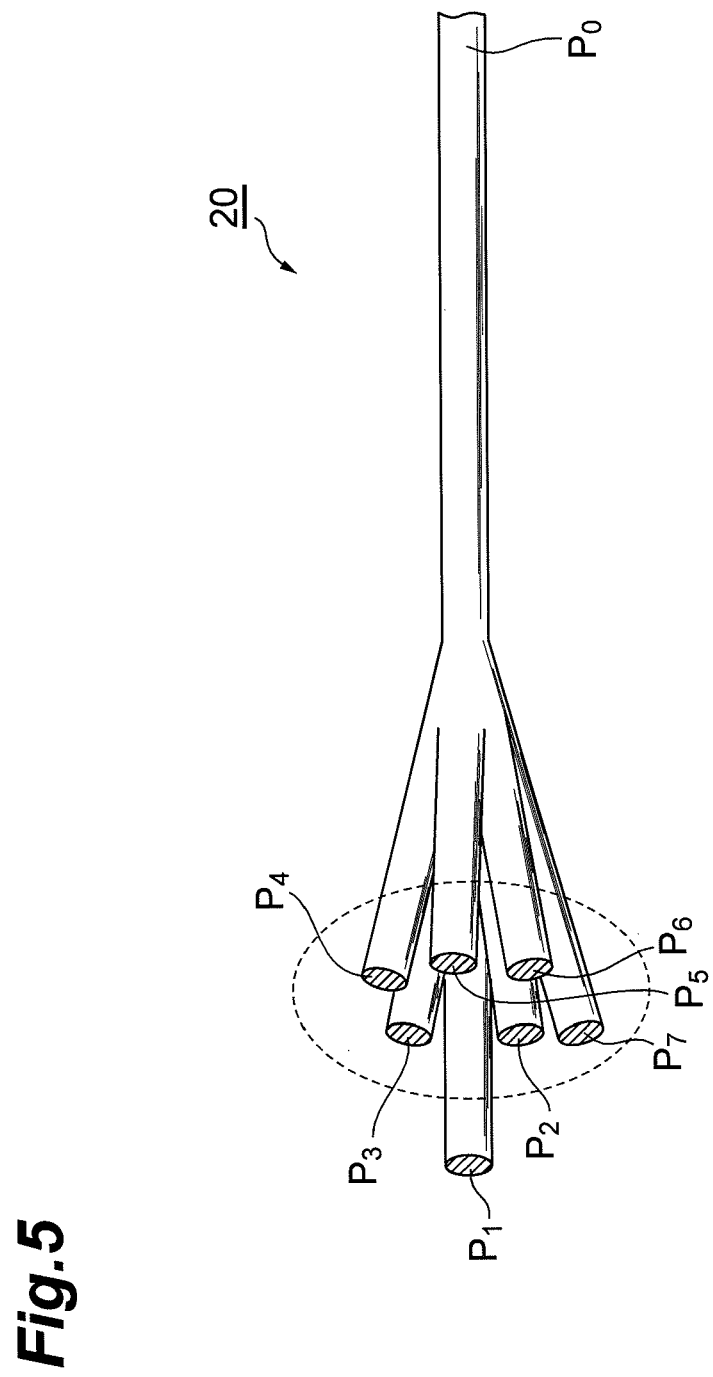
FIG. 5 is a view for explaining a configuration of a combiner.

FIG. 5 shows a configuration of the combiner 20. The combiner 20 shown in FIG. 5 has a plurality (seven in the example of FIG. 5) of light input/output ports $P_1$ to $P_7$ on one side, and has a common port $P_0$ on the other side. The combiner 20 combines lights inputted into the light input/output ports $P_1$ to $P_7$, and outputs the combined light from the common port $P_0$. The combiner 20 divides light inputted into the common port $P_0$ and outputs the divided lights from the light input/output ports $P_1$ to $P_7$.

The optical fiber on the common port $P_0$ side of the combiner 20 has the same double cladding structure as in the amplification optical fiber 10, and is connected to the amplification optical fiber 10. The light input/output port $P_1$ is optically connected to the seed light source 41 via the optical fiber 42. The light input/output port $P_2$ is optically connected to the pumping light source 31 via the optical fiber 32. Only one input port for pumping light from the pumping light source 31 is shown in FIG. 1, however, other light input/output ports $P_3$ to $P_7$ may also be optically connected to other pumping light sources via other optical fibers.

A pulse generation method in the laser light source apparatus B1 according to the comparative example will be described. As described above, the laser light source apparatus B1 according to the comparative example comprises the seed light source 41, the optical fiber 42, the modulator 51, the electric signal line 52, and the driving current supply section 70. The pulse modulation to the seed light source 41 is normally performed according to a direct modulation method or an external modulation method, however, in the laser light source apparatus B1 shown in FIG. 1, laser light outputted from the seed light source 41 is pulsed according to a direct modulation method.

The laser light source apparatus B1 adopting the direct modulation method is provided with a driving current supply section 70 which steadily supplies a driving current by controlling a current value of the driving current to be supplied to the seed light source 41, and a modulator 51 which applies a modulation voltage E to the seed light source 41 according to a pulse modulation pattern (modulation voltage change pattern for the seed light source 41 from the modulator 51, for instructing a pulse-ON state and a pulse-OFF state in the seed light source 41).

Figure 6:
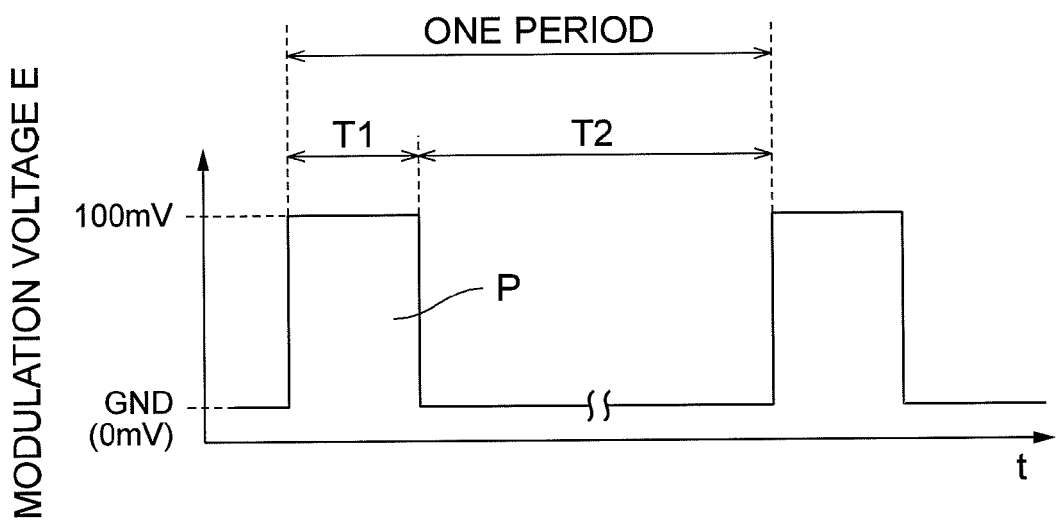
FIG. 6 is a view for explaining a pulse generation method according to the comparative example.

Here, FIG. 6 shows a pulse modulation pattern showing time changes in modulation voltage E to be applied from the modulator 51 to the seed light source 41. In FIG. 6, the modulation period in the modulation signal pattern corresponds to one period of the light pulse L which should be generated, and consists of a period T1 (signal width of the pulse signal P) showing a pulse-ON state and a period T2 showing a pulse-OFF state. For example, FIG. 6 shows a pulse modulation pattern in a state that a driving current of 100 mA is supplied, and in the pulse-ON state, that is, in the period T1, the modulation voltage E of 100 mV is applied from the modulator 51 to the seed light source 41. On the other hand, in the period T2 corresponding to the pulse-OFF state, the modulation voltage E at the GND (0 mV) level is applied from the modulator 51 to the seed light source 41. A reverse phase operation is also possible in the electric circuit of the modulator 51, and the state in T1 may be the pulse-OFF state and the state in T2 may be the pulse-ON state. In this case, the widths of the periods T1 and T2 are reversed. The modulation voltage value in the state in the period T1 is 100 mV, and the modulation voltage value in the state in the period T2 is at the GND (0 mV) level. As described later, in the state that the driving current is changed, the modulation voltage value in the pulse-ON state and the modulation voltage value in the pulse-OFF state are different.

The voltage value $V_{off}$ of the modulation voltage E in the pulse-OFF state is not always at the GND (0V) level, and varies depending on the type of the seed light source 41 and the driver circuit inside the driving current supply section 70. Hereinafter, this will be described in detail.

Figures 7A, 7B:
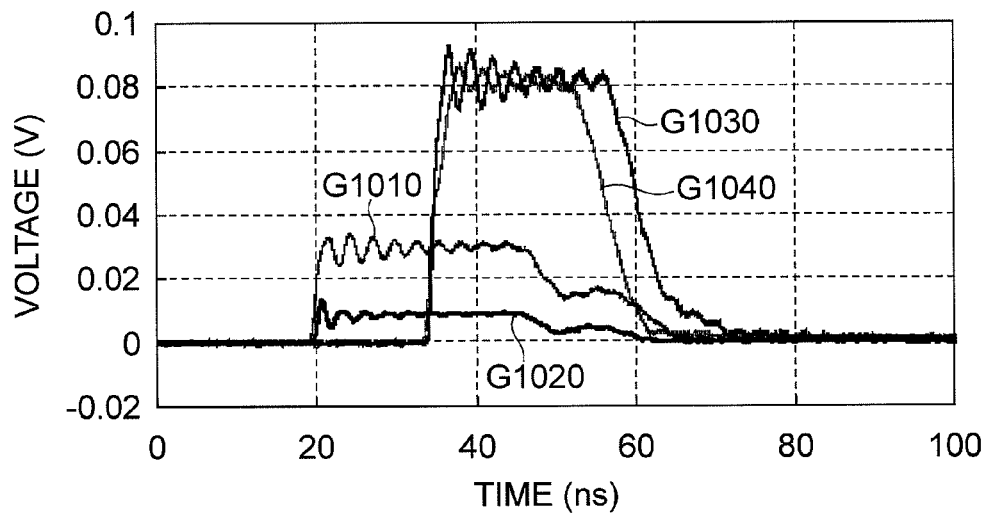
FIGS. 7A and 7B are views for explaining light pulse waveform changes when the driving current, the amplitude of the modulation voltage, and the offset of the modulation voltage are changed.

FIG. 7A shows changes in light pulse waveform when the driving current, the amplitude of the modulation voltage, and the offset of the modulation voltage are respectively changed. The graph G1010 shows changes in light pulse waveform under Condition 1 shown in FIG. 7A, the graph G1020 shows changes in light pulse waveform under Condition 2 shown in FIG. 7B, the graph G1030 shows changes in light pulse waveform under Condition 3 shown in FIG. 7B, and the graph G1040 shows changes in light pulse waveform under Condition 4 shown in FIG. 7B. The vertical axis of FIG. 7A shows the voltage value of output power of the outputted light pulse, and the horizontal axis shows the time change. In this example, the modulator offset given alone shows a pulse-OFF state, and "modulator offset+modulator amplitude" shows a pulse-ON state. In Condition 2, the driving current is 200 mA and is higher than in Condition 1 (100 mA), however, the pulse peak becomes lower. In Condition 3, the modulator amplitude is 100 mV and becomes smaller than in Condition 2 (200 mV), however, the pulse peak becomes higher. In Condition 4, the modulator amplitude offset is 125 mV and becomes higher than in Condition 3 (116 mV), and accordingly, the pulse width becomes smaller. Concerning the pulse peak, not only the driving current but also the modulator amplitude must be properly set. Concerning the pulse width, the modulator offset must be additionally properly set.

When the driving current is set to 200 mA, in the modulator 51, the modulation voltage E to be outputted in the period T1 showing a pulse-ON state is set to 200 mV while the modulation voltage E to be outputted in the period T2 showing a pulse-OFF state must be set to GND (0 mV). However, when the modulation voltage E in the period T1 outputted from the modulator 51 is 100 mV, there is a possibility that a light pulse with a normal waveform cannot be obtained, or the amplification optical fiber 10 cannot send the seed light pulse L at all. The light pulse with "normal waveform" means light pulse with a predetermined pulse width in comparison with a planned pulse width. For example, when the actual pulse width is within ±20% (preferably ±10%) of the planned pulse width, it is regarded as normal.

Figure 8A:
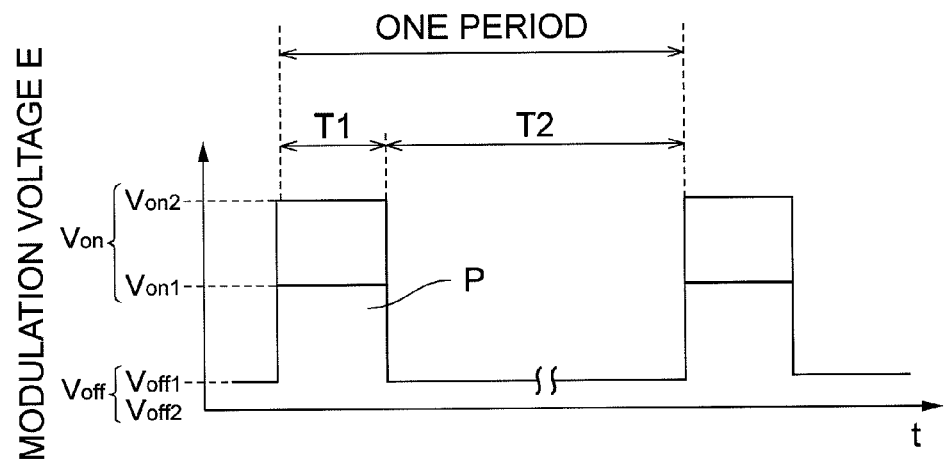
FIGS. 8A and 8B are views for explaining correspondence relationship between the modulation voltage and the driving current.
Figure 8B:
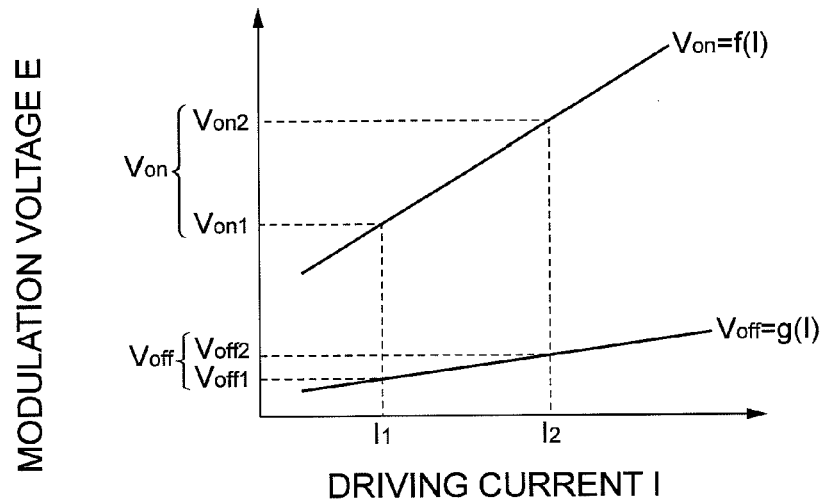

FIG. 8A shows a pulse modulation pattern, and FIG. 8B shows the relationship between the driving current I and the modulation voltage E corresponding to the pulse modulation pattern of FIG. 8A.

In FIG. 8A, the pulse period of the pulse modulation pattern corresponds to one period of the light pulse L to be generated, and is constituted by the period T1 (signal width of the pulse signal P) showing a pulse-ON state and the period T2 showing a pulse-OFF state. The modulation voltage E to be outputted from the modulator 51 is set to mutually different values in the pulse-ON state and the pulse-OFF state according to the value of the driving current I so that the period T1 is kept. For example, when the driving current value is $I_1$ or $I_2$, the voltage value $V_{on}$ in the pulse-ON state is set to $V_{on1}$ or $V_{on2}$, and on the other hand, the voltage value $V_{off}$ in the pulse-OFF state is set to $V_{off1}$ or $V_{off2}$. FIG. 8B shows the correspondence relationship ($V_{on}$=f(I)) between the driving current I and the modulation voltage value $V_{on}$ in the pulse-ON state and the correspondence relationship ($V_{off}$=g(I)) between the driving current I and the modulation voltage value $V_{off}$ in the pulse-OFF state. Therefore, when the driving current value is $I_1$, the voltage value of the modulation voltage E in the pulse-ON state is set to $V_{on1}$, and the voltage value of the modulation voltage E in the pulse-OFF state is set to $V_{off1}$. On the other hand, when the current value of the driving current I is $I_2$, the voltage value of the modulation voltage E in the pulse-ON state is set to $V_{on2}$, and the voltage value of the modulation voltage E in the pulse-OFF state is set to $V_{off2}$.

The basic pulse modulation pattern is stored in the modulator 51, and the storage section 81 in the modulation control section 80 stores a data group of the driving current value and the modulation voltage value associated with each other by the functions f(I) and g(I) shown in FIG. 8B as data in the form of a correspondence table showing the correspondence relationship between these driving current value and modulation voltage value. The storage section 81 may store the functions f(I) and g(I) showing the correspondence relationships between the driving current value and the modulation voltage values in the pulse-ON state and the pulse-OFF state. In this case, based on the stored functional equation and the driving current value I supplied from the driving current supply section 70, the arithmetic section 82 calculates modulation voltage values $V_{on}$ and $V_{off}$ which should be outputted from the modulator 51, and based on these, the arithmetic section 82 determines the modulator amplitude (mA) and the modulator offset (mV) to be sent to the modulator 51.

The voltage value $V_{on}$ in the pulse-ON state and the voltage value $V_{off}$ in the pulse-OFF state in FIGS. 8A and 8B represent the relationship between the driving current and the modulation voltage when the pulse width is set to one predetermined width based on the above-described knowledge. The modulation voltage $V_{off}$ is "modulator offset," and the modulation voltage $V_{on}$ is "modulator offset+modulator amplitude." These are set by being converted into the modulation voltage E, however, the modulator offset and the modulator amplitude may be directly set without conversion, as data showing the correspondence relationship between the modulation voltage and the driving current. When this data is collected in advance for each pulse width, a desired pulse width can be realized. The pulse peak can be set according to the driving current, and when the correspondence relationship between the pulse peak and the driving current is investigated in advance and the data is acquired, a desired pulse peak can be realized.

Figure 9:
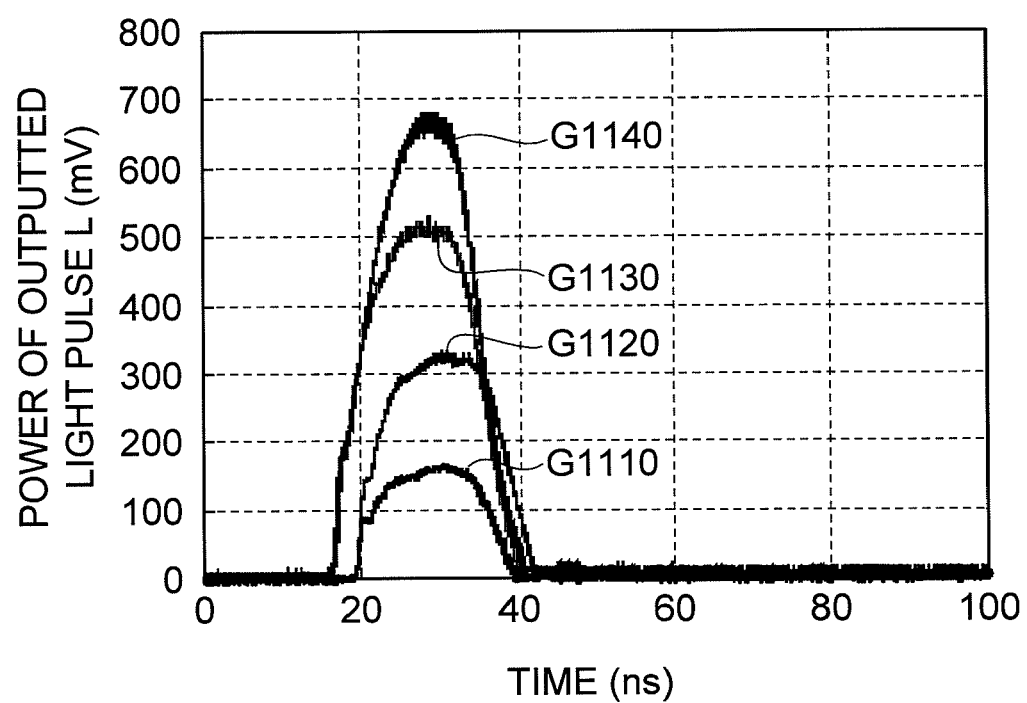
FIG. 9 is a view showing power of light pulse output from a laser light source apparatus according to the present embodiment.

FIG. 9 shows power of a light pulse outputted from the laser light source apparatus B according to the present embodiment. As shown in FIGS. 8A and 8B, the pulse waveform is when the modulation voltage is set to a proper amplitude and offset value corresponding to the value of the driving current I. The graph G1110 shows a light pulse waveform obtained when the driving current I is 100 mA, the graph G1120 shows a light pulse waveform obtained when the driving current I is 150 mA, the graph G1130 shows a light pulse waveform obtained when the driving current I is 200 mA, and the graph G1140 shows a light pulse waveform obtained when the driving current I is 250 mA. Based on the data of FIGS. 8A and 8B, by controlling the driving current under the condition that the pulse width is fixed, the pulse peak value is changed. In this regard, $V_{off}$ is set to GND (0V).

Detailed values are applied to the above-described pulse generation method. In addition, when the driving current value I is 100 mA, by setting the modulation voltage value $V_{on}$ to 100 mV, a normal seed light pulse L can be obtained. When the driving current value I is 200 mA, by setting the modulation voltage value $V_{on}$ to 200 mV, a normal seed light pulse L can be obtained.

In FIG. 9, for example, when the driving current I=100 mA, by setting the amplitude of the modulation voltage E to 200 mV and the offset to 100 mV, a pulse-ON state and a pulse-OFF state can be created by extracting the waveform in either the "+" or "−" direction based on the offset. Whether the pulse-ON state is set in the "+" or "−" direction depends on the circuit design conditions, so that the effect does not change between these. When the driving current I=200 mA, by setting the amplitude of the modulation voltage E to 400 mV and the offset to 200 mV, a pulse-ON state and a pulse-OFF state can be created by extracting the waveform in either the "+" or "−" direction based on the offset.

Here, it is a natural effect that the peak value of the light pulse becomes higher by increasing the driving current value, and further, it is understood from FIG. 9 that the pulse width in the pulse-ON state is actually kept at a fixed width. The phenomenon, in which the pulse width at the top of the light pulse becomes narrower than the pulse width at the bottom of the light pulse, depends on the rising and falling times of the seed light source 41 or the response speed of the modulator 51 itself. Here, $V_{off}$ is set to GND (0V), however, by setting $V_{off}$ to a proper value, the pulse width is improved.

Figure 10:
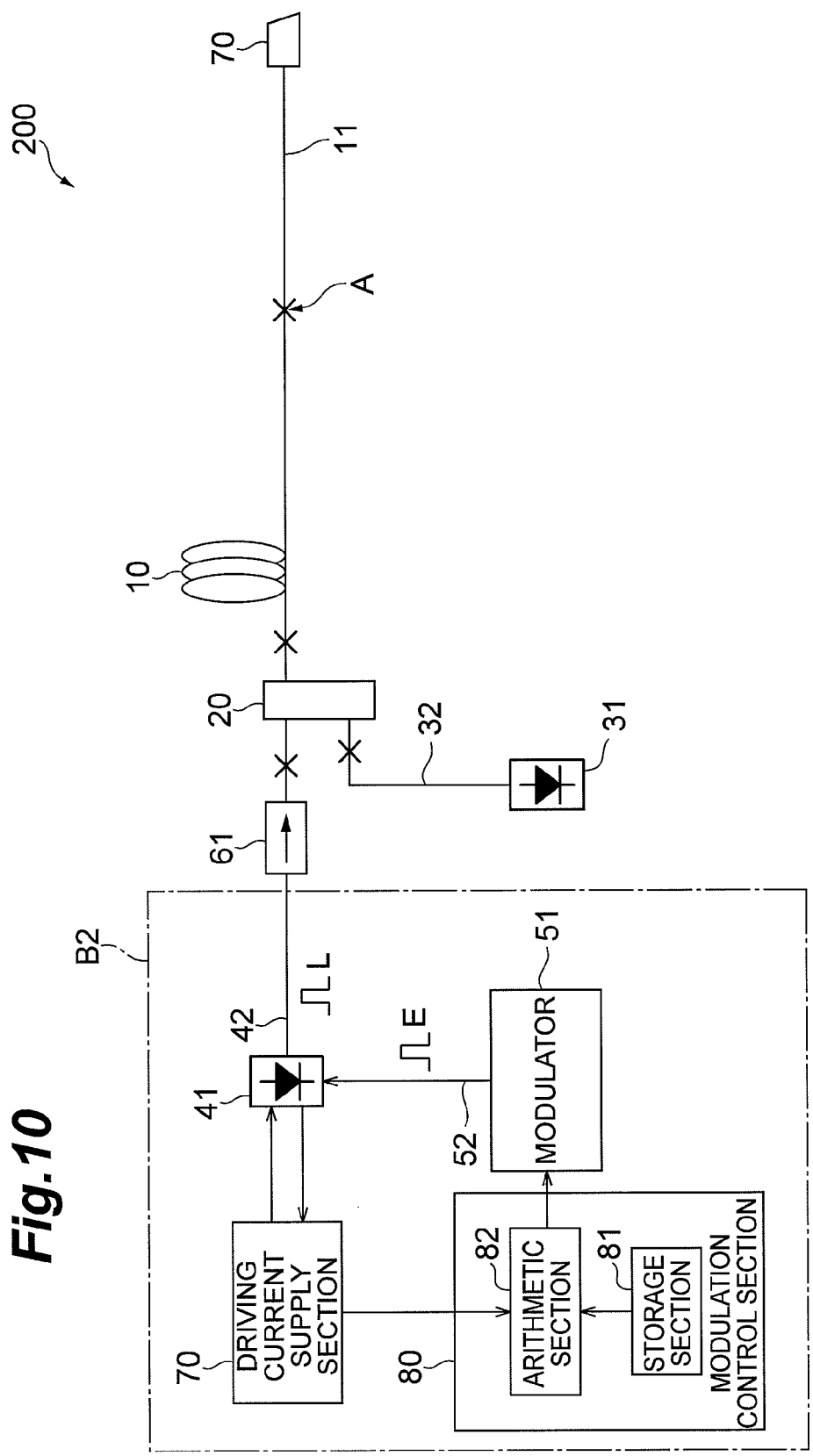
FIG. 10 is a view showing a configuration of an optical fiber laser to which an embodiment of a laser light source apparatus according to the present invention is applied.

FIG. 10 shows a configuration of an optical fiber laser to which a laser light source apparatus according to the present embodiment is applied. In FIG. 10, the optical fiber laser 200 comprises an amplification optical fiber 10, a combiner 20, a pumping light source 31, an optical fiber 32, a laser light source apparatus B2, an optical isolator 61, a delivering optical fiber 11, and a light exit end 70, and has the same configuration as that of the optical fiber laser 100 shown in FIG. 1 except for the configuration of the laser light source apparatus.

The laser light source apparatus B2 comprises a seed light source 41, an optical fiber 42, a modulator 51, an electric signal line 52, a driving current supply section 70, and a modulation control section 80. The modulator 51 has data on a modulation pattern as a change pattern of a modulation voltage for generating a light pulse, and applies a modulation voltage E to the seed light source 41 based on the data. The data on the modulation pattern is data on the modulation period (or recurrence frequency), the pulse width, the offset voltage, and the amplitude voltage. The modulation control section 80 sends the data on the modulation voltage (at least the offset voltage and the amplitude voltage) and controls the modulator 51. The driving current supply section 70 determines a driving current to be sent based on installed data (not shown) on the correspondence relationship with a target driving current value, and supplies the determined driving current to the seed light source 41. The modulation control section 80 has a storage section 81, and stores the data on the correspondence relationship between the driving current and the modulation voltage. The data on the correspondence relationship between the driving current and the modulation voltage is data confirmed in advance about the relationship between the driving current value and the modulation voltage value as shown in FIGS. 8A and 8B, and is data in the form of a correspondence table and a correspondence function, etc. The modulation control section 80 monitors the driving current supplied from the driving current supply section 70 to the seed light source 41, and determines an optimum modulation voltage for obtaining a predetermined pulse width based on the correspondence relationship between the driving current value and the modulation voltage value, and sends information on the optimum modulation voltage to the modulator 51. When a pulse peak value is instructed from the modulation control section 80, data on a target driving current value is stored in the storage section 81, and at a proper timing, the data is sent to and stored in the driving current supply section 70 as a target driving current value of the driving current supply section 70. In this case, it is arbitrarily selected when needed as to whether the monitor value in the modulation control section 80 is fixed to the target driving current value or set to an actually monitored value.

Figure 11A:
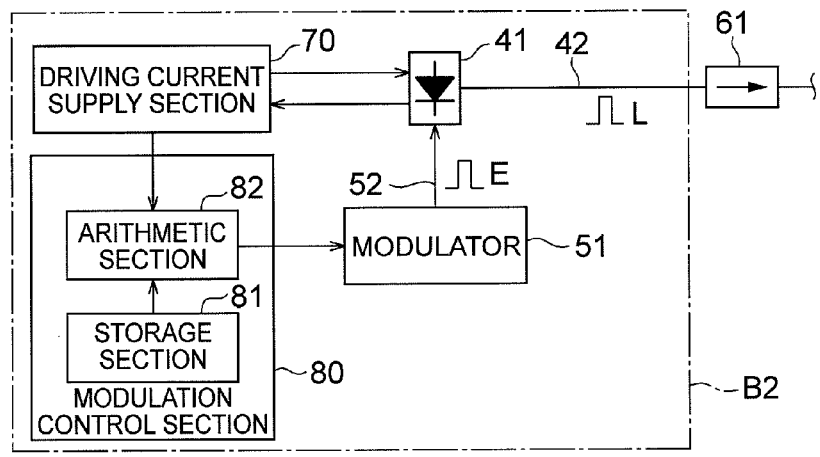
FIGS. 11A to 11C are views showing configurations of exemplary variations of the laser light source apparatus according to the present embodiment.
Figure 11B:
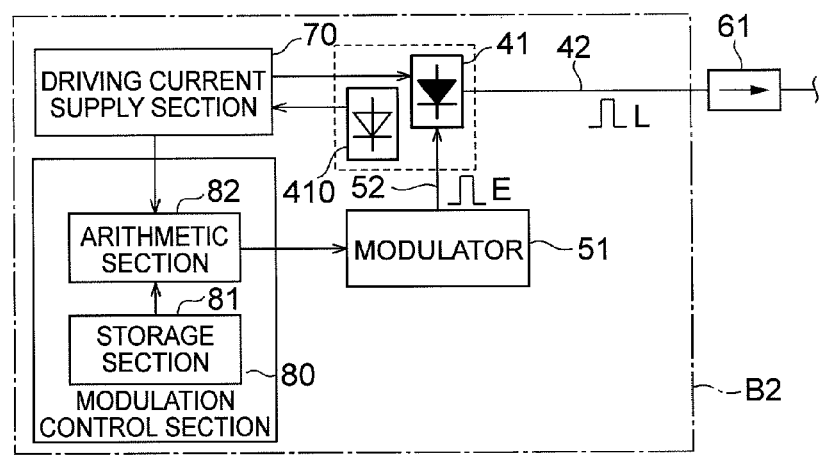
Figure 11C:
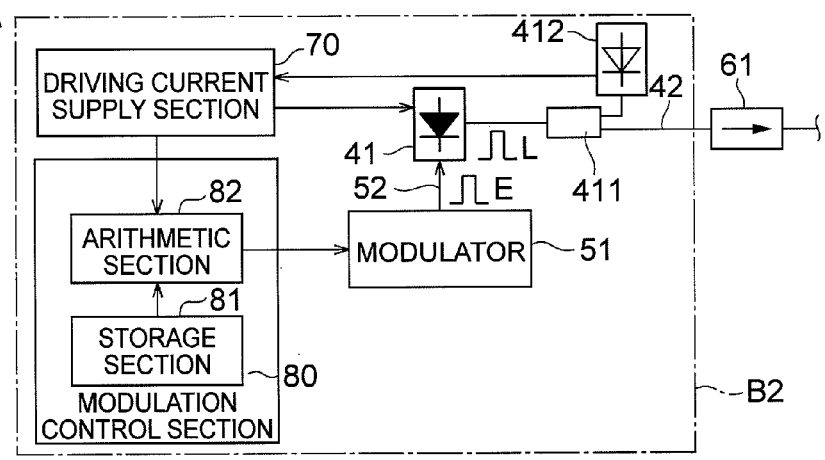

As a driving current control method, feedback control of the driving current to be supplied to the seed light source 41 is common, which includes, for example, constant current control (ACC: Automatic Current Control) and constant output control (APC: Automatic Power Control), etc. FIGS. 11A to 11C show configurations of exemplary variations of the laser light source apparatus B2 of the present embodiment. FIG. 11A shows a configuration of the laser light source apparatus B2 which performs ACC as feedback control of the driving current, and FIG. 11B and FIG. 11C show a configuration of the laser light source apparatus B2 which performs APC as feedback control of the driving current. In the ACC, the seed light source 41 monitors the supplied driving current and sends information on the monitored current value to the modulation control section 80, and the modulation control section 80 controls the driving current based on the information on the monitored current value. In the APC, particularly, the laser light source apparatus B2 shown in FIG. 11B has a configuration for controlling the driving current to be supplied to the seed light source 41 from the driving current supply section 70 based on monitor information obtained by monitoring a part of output light power by a back monitor detector 410 provided inside the seed light source 41. The laser light source apparatus B2 shown in FIG. 11C has a configuration for separating a part of the seed light pulse L outputted from the seed light source 41 by an optical coupler 411, and detecting output light power by a photodetector 412 provided outside the seed light source 41. Also, in the laser light source apparatus B2 shown in FIG. 11C, the driving current to be supplied from the driving current supply section 70 to the seed light source 41 is controlled based on monitor information from the photodetector 412. The photodetectors 410 and 412 are preferably, for example, PDs (photodiodes). In the APC, the actual pulse peak value may fluctuate due to temperature fluctuation, and by performing the control while measuring the actual power, the pulse peak value can be fixed.

In the pulse generation method according to the present embodiment, while the value of the driving current to be supplied to the seed light source 41 is controlled according to the control method shown in FIGS. 11A to 11C, the modulation control section 80 determines an optimum modulation voltage for obtaining a predetermined pulse width corresponding to data on the correspondence relationship between the driving current and the modulation voltage based on the actually supplied driving current value, and sends the information on the optimum modulation voltage to the modulator 51.

Figure 12:
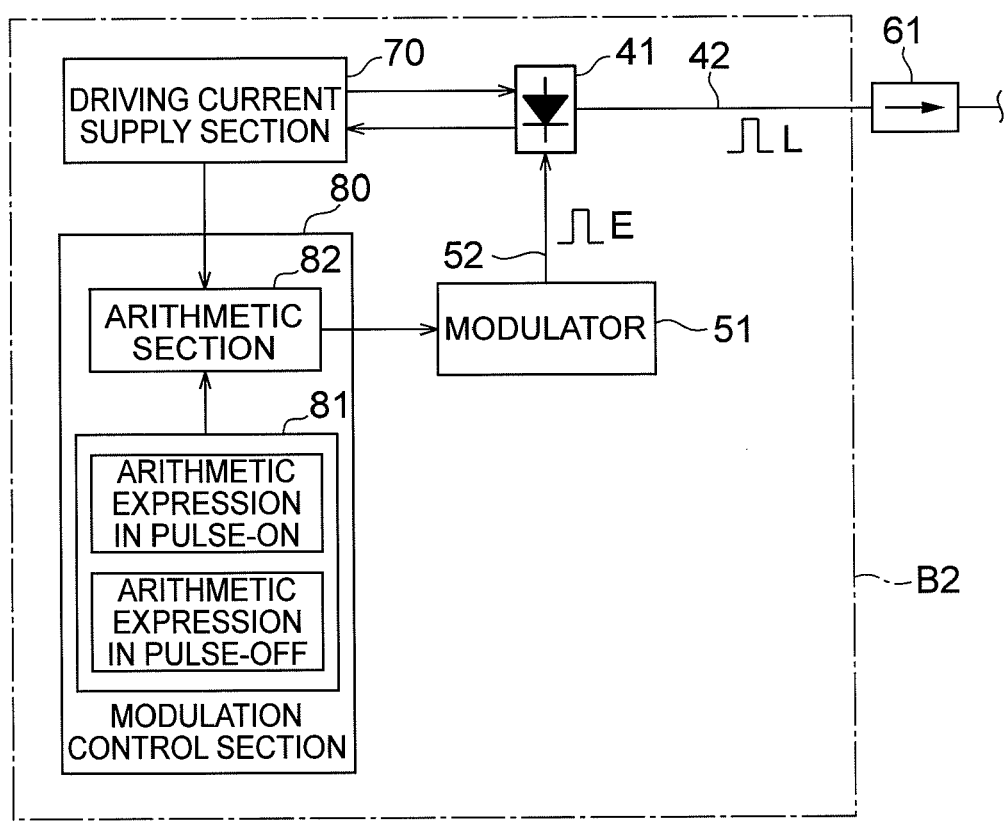
FIG. 12 is a view showing an exemplary variation of the laser light source apparatus according to the present embodiment.

FIG. 12 shows a configuration of a laser light source apparatus according to an embodiment of the present invention. Arithmetic expressions expressing the relationships between the driving current and the drive modulation voltages in the pulse-ON state and the pulse-OFF state are stored in the storage section 81 in the modulation control section 80. The arithmetic section 82 in the modulation control section 80 calculates the value of the modulation voltage which should be outputted from the modulator 51 based on these arithmetic expressions and the value of the driving current outputted from the driving current supply section 70, and based on the calculated value, determines a modulator amplitude (mA) and a modulator offset (mV) to be sent to the modulator 51. It is also possible that correspondence table data on correspondence relationship between the driving current and the modulation voltage is stored in advance in the storage section 81 in the modulation control section 80 and the stored data is set as reference values. For example, in a pulse modulation pattern in a state in which the driving current of 100 mA is supplied to the seed light source 41, a modulation voltage value of 100 mV is supplied in the pulse-ON state, and on the other hand, a modulation voltage value of GND (0V) is supplied in the pulse-OFF state. The same effect is obtained even when a reversed phase is applied to the electric circuit in the modulator 51 and a modulation voltage of GND (0V) is supplied in the pulse-ON state and a modulation voltage of 100 mV is supplied in the pulse-OFF state.

The modulation control section 80 may be installed inside the modulator 51 instead of being packaged separate from the modulator 51. The information on the driving current is directly inputted into the modulator 51 from the driving current supply section, and inside the modulator 51, the information passes through a portion originally functioning as the modulation control section 80, and a modulator amplitude (mA) and a modulator offset (mV) which are information on the modulation voltage are sent to a portion originally functioning as the modulator 51.

Figure 13:
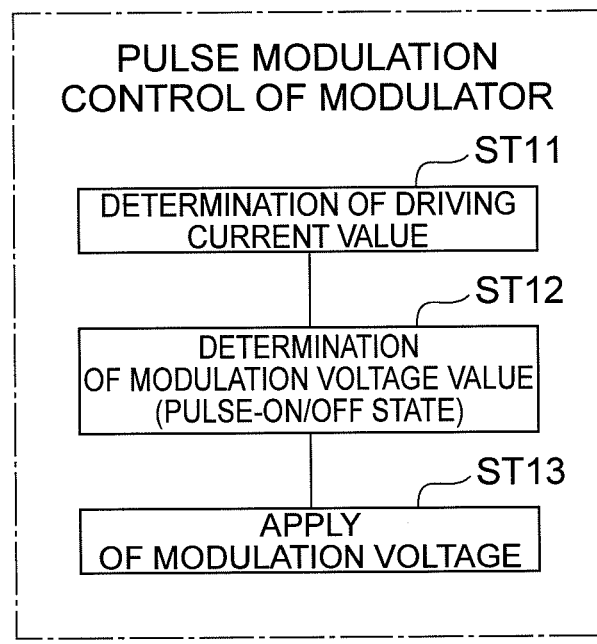
FIG. 13 is a flowchart for explaining an example of pulse modulation control in the modulation control section and the modulator.

In this embodiment, the modulator 51 itself has information on the basic modulation pattern (the recurrence frequency and the pulse-ON time), and is used when pulsing only a portion which needs to be pulsed. FIG. 13 shows a flowchart of operations of pulse modulation control. First, a driving current value is determined (Step ST11). Next, based on the determined driving current value, modulation voltage values in the pulse-ON state and the pulse-OFF state are determined (Step ST12). After the voltage values are thus determined, information on the modulation voltages of the modulator 51 including values corresponding to the pulse-ON state and the pulse-OFF state are applied to the seed light source 41 (Step ST13). This is because, in a state in which the driving current value is unstable, the modulation voltage value of the modulator is also unstable, and the laser light source apparatus may fail.

Figure 14:
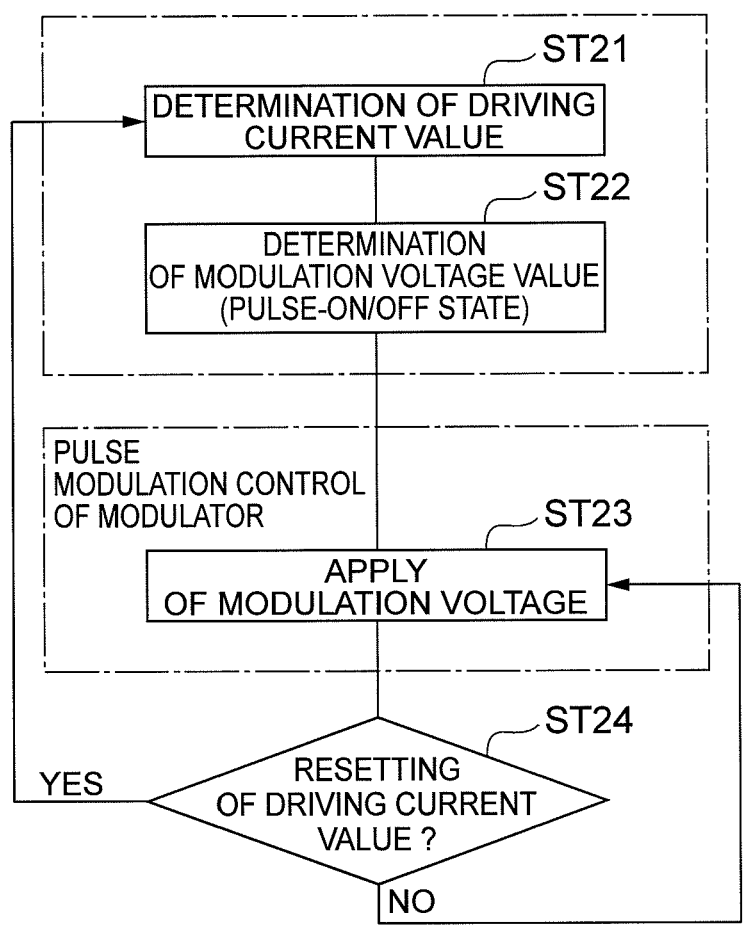
FIG. 14 is a flowchart for explaining another example of pulse modulation control in the modulation control section and the modulator.

FIG. 14 is a flowchart of operations of pulse modulation control when the driving current value is fixed. In particular, the driving current value is temporarily fixed and determined according to the respective control methods shown in FIGS. 11A to 11C (Step ST21). Further, the modulation voltage values of the modulator 51 are also determined based on the determined driving current value (Step ST22). After this determination, the pulse modulation control of the modulator 51 itself, that is, the determined modulation voltage values in the pulse-ON state and the pulse-OFF state are applied to the seed light source 41 (Step ST23). When the driving current value is not changed to other values, in ST24, the process is returned back to ST22 and the same operation is continued. When the driving current value is changed to a different value and fixed, in Step ST24, the process is returned back to ST21 and the different driving current value is reset. The driving current value and the modulation voltage value are fixed again (Steps ST21 and ST22), and information on the newly fixed modulation voltage is applied from the modulator 51 to the seed light source 41. In this pulse modulation control, driving current value fluctuation which becomes the basis for modulation voltage value determination disappears, so that the fluctuation of the pulse generation operation itself becomes smaller and this is advantageous. By setting the modulation voltage value of the modulator 51 to a greatly different value, switching between CW light output and light pulse output can be performed. For example, switching between CW light output and light pulse output can be performed while the LD as the seed light source 41 is made to always emit light (while the degree of stability of the light output is kept). In accordance with this configuration, the stability of the seed light source as a processing laser can be maintained, so that stable processing quality can be obtained.

In FIGS. 13 and 14, information on the modulation voltage is calculated in the arithmetic section inside the modulation control section as information including the offset voltage and the modulation amplitude voltage of the modulator, and applied to the modulator. A modulation voltage in either the pulse-ON state or the pulse-OFF state corresponds to the offset voltage of the modulator, and the difference between the modulation voltage in the one state and the modulation voltage in the other state corresponds to the modulation amplitude voltage.

However, as in the above-described embodiment, automatic control of voltage value setting of the modulation voltage to be outputted from the modulator 51 with respect to the set value of the driving current to be supplied to the seed light source is more preferable because this enables adjustment of the modulation voltage value quicker and reduces human errors caused by erroneous setting, and a safer laser light source apparatus can be obtained.

As described above, in accordance with the present invention, in setting of conditions for direct modulation of a light emitting element, a pulse peak and a pulse width of a light pulse can be simultaneously set to desired values, and the pulse peak and the pulse width of the light pulse can be automatically set, the pulse waveform can be prevented from fluctuating, waveform deterioration of the light pulse caused by fluctuation of a driving current to be supplied to the seed light source is suppressed, and a light pulse with a normal waveform can be stably generated.

What is claimed is:

1. A pulse generation method of a light emitting element, the method comprising the steps of:
preparing a seed light source which includes a light emitting element outputting laser light; a driving current supply section supplying a driving current to the light emitting element; a modulator applying a modulation voltage for pulse modulation of the laser light to the seed light source according to a pulse modulation pattern of the modulation voltage for instructing a pulse-ON state and a pulse-Off state of the seed light source; and a modulation control section determining optimal modulation voltages for a predetermined pulse width, in both the pulse-ON state and the pulse-OFF state;
monitoring the driving current supplied to the seed light source or output light power from the seed light source;
setting, in response to change of the driving current value, the modulation voltages in both of the pulse-ON state and the pulse-OFF state which respectively correspond to the driving current in both pulse-ON state and the pulse-OFF state after the change of the driving current value so that a pulse width after the driving current value change falls within ±20% with reference to the predetermined pulse width the set modulation voltage in the pulse-ON state being different from the modulation voltage in the pulse-ON state which corresponds to the driving current in the pulse-ON state before the change of the driving current value, the set modulation voltage in the pulse-OFF state being different from the modulation voltage in the pulse-ON state which corresponds to the driving current in the pulse-ON state before the change of the driving current value; and
making the modulation control section send information on the pulse modulation pattern to the modulator so that the modulation voltage in the pulse-ON state and the modulation voltage in the pulse-OFF state respsectively reaches the set values.

2. The pulse generation method of a light emitting element according to claim 1, wherein the driving current to be outputted from the driving current supply section is controlled so as to become fixed at a predetermined value in a period in which a modulation voltage value is fixed in the pulse modulation pattern.

3. The pulse generation method of a light emitting element according to claim 1, wherein the driving current to be outputted from the driving current supply section is controlled so that a monitor value of power of output light of the light emitting element reaches a predetermined value.

4. The pulse generation method of a light emitting element according to claim 3, wherein the monitor value is an electric signal from a back monitor detector provided inside the light source or a photodetector provided outside the light source.

5. The pulse generation method of a light emitting element according to claim 1, wherein a correspondence relationship between the driving current value and the modulation voltage value is preset as a correspondence table or a correspondence function, and
wherein the modulation voltage value is set based on information on the driving current value and the correspondence relationship.

6. A laser light source apparatus, comprising:
a seed light source which includes a light emitting element outputting laser light;
a driving current supply section supplying a driving current to the light emitting element;
a modulator applying a modulation voltage for pulse modulation of the laser light to the seed light source according to a pulse modulation pattern of the modulation voltage for instructing a pulse-ON state and a pulse-OFF state of the seed light source; and
a modulation control section determining optimal modulation voltages for a predetermined pulse width, in both the pulse-ON state and the pulse-OFF state,
wherein the modulation control section includes a storage section for storing the correspondence relationship between the driving current value and the modulation voltage value, and an arithmetic section which monitors the driving current supplied to the seed light source or output light power from the seed light source and sets the modulation voltage value in the pulse modulation pattern based on information on the driving current value and the correspondence relationship between the driving current value and the modulation voltage value, and
wherein the arithmetic section:
sets, in response to change of the driving current value, the modulation voltages in both of the pulse-ON state and the pulse-OFF state which respectively correspond to the driving current in both pulse-ON state and the pulse-OFF state after the change of the driving current value so that a pulse width after the driving current value change falls within ±20% with reference to the predetermined pulse width the set modulation voltage in the pulse-ON state being different from the modulation voltage in the pulse-ON state which corresponds to the driving current in the pulse-ON state before the change of the driving current value, the set modulation voltage in the pulse-OFF state being different from the modulation voltage in the pulse-ON state which corresponds to the driving current in the pulse-ON state before the change of the driving current value; and
sends information on the pulse modulation pattern to the modulator so that the modulation voltage in the pulse-ON state and the modulation voltage in the pulse-OFF state respectively reaches the set values.

7. The laser light source apparatus according to claim 6, wherein the storage section stores the correspondence relationship between the driving current value and the modulation voltage value as data in the form of a correspondence table.

8. The laser light source apparatus according to claim 6, wherein the storage section stores the correspondence relationship between the driving current value and the modulation voltage value as a correspondence functional equation.

\* \* \* \* \*

UNITED STATES PATENT AND TRADEMARK OFFICE
CERTIFICATE OF CORRECTION

| | |
|---|---|
| PATENT NO. | : 8,693,514 B2 |
| APPLICATION NO. | : 12/755918 |
| DATED | : April 8, 2014 |
| INVENTOR(S) | : Shinobu Tamaoki |

It is certified that error appears in the above-identified patent and that said Letters Patent is hereby corrected as shown below:

In the Claims

In claim 1, column 13, in line 46, "pulse width the set modulation" should be --pulse width, the set modulation--.

In claim 1, column 13, line 58, "respsectively" should be --respectively--.

In claim 6, column 14, in line 48, "pulse width the set modulation" should be --pulse width, the set modulation--.

Signed and Sealed this
Twenty-sixth Day of August, 2014

Michelle K. Lee
*Deputy Director of the United States Patent and Trademark Office*